United States Patent [19]

Einthoven

[11] Patent Number: 4,742,377
[45] Date of Patent: May 3, 1988

[54] SCHOTTKY BARRIER DEVICE WITH DOPED COMPOSITE GUARD RING

[75] Inventor: Willem G. Einthoven, Belle Mead, N.J.

[73] Assignee: General Instrument Corporation, New York, N.Y.

[21] Appl. No.: 922,532

[22] Filed: Oct. 23, 1986

Related U.S. Application Data

[60] Division of Ser. No. 703,703, Feb. 21, 1985, Pat. No. 4,638,551, which is a continuation of Ser. No. 422,386, Sep. 24, 1982, abandoned.

[51] Int. Cl.$^4$ .......................................... H01L 29/48
[52] U.S. Cl. ...................................... 357/15; 357/52; 357/13; 357/20
[58] Field of Search ................... 357/15, 52, 52 D, 13, 357/13 U, 23.11, 20

[56] References Cited

U.S. PATENT DOCUMENTS

| | | | |
|---|---|---|---|
| 3,113,220 | 12/1963 | Goulding et al. | 357/52 X |
| 3,146,135 | 8/1964 | Chih-Tang Sah | 148/33.3 |
| 3,204,160 | 8/1965 | Chih-Tang Sah | 357/34 X |
| 3,243,669 | 3/1966 | Chih-Tang Sah | 357/34 X |
| 3,341,380 | 9/1967 | Mets et al. | 357/52 X |
| 3,397,450 | 8/1968 | Bittmann et al. | 357/15 X |
| 3,513,366 | 5/1970 | Clark | 357/15 X |
| 3,515,956 | 6/1970 | Martin et al. | 357/52 X |
| 3,541,403 | 11/1970 | Lepselter et al. | 357/15 X |
| 3,694,705 | 9/1972 | Wenzig | 357/52 X |
| 3,769,109 | 10/1973 | Macrae et al. | 156/3 |
| 3,891,479 | 6/1973 | Zwernemann | 357/15 X |
| 3,907,617 | 9/1975 | Zwernemann | 357/15 X |
| 3,923,975 | 12/1975 | Calviello | 357/15 X |
| 3,938,243 | 2/1976 | Rosvold | 357/67 S X |
| 4,000,502 | 12/1976 | Butler et al. | 357/30 X |
| 4,206,540 | 6/1980 | Gould | 29/590 |
| 4,223,327 | 9/1980 | Nara et al. | 357/15 |
| 4,310,362 | 1/1982 | Roche et al. | 357/15 X |
| 4,377,030 | 3/1983 | Pettenpaul et al. | 357/15 X |
| 4,505,023 | 3/1985 | Tseng et al. | 357/91 X |

FOREIGN PATENT DOCUMENTS 5585077  6/1980  Japan .............................. 357/52 D

OTHER PUBLICATIONS

Adler et al., "Theory and Breakdown Voltage for Planar Devices with a Single Field Limiting Ring," *IEEE Transactions*, Feb. 77, pp. 107-113.

Yu, "The Metal-Semiconductor Contact: An Old Device With a New Future," *IEEE Spectrum*, vol. 7. No. 3, Mar. 70, pp. 83-89.

Kao et al., "High-Voltage Planar P-N Junctions," *Proceedings of the IEEE*, vol. 55, No. 8, Aug. 1967, pp. 1409-1414.

(Continued on next page.)

Primary Examiner—Andrew J. James
Assistant Examiner—William A. Mintel
Attorney, Agent, or Firm—Roland Plottel

[57] ABSTRACT

An improved Schottky barrier device and the method of its manufacture are disclosed. The device comprises a semiconductor layer of first conductivity type, an insulating layer covering one face of the semiconductor layer and having an opening therein, a conductor layer covering the semiconductor layer where it is exposed by the opening and forming a Schottky contact with the semiconductor layer, a first region of opposite conductivity type within the semiconductor layer generally beginning where the conductor layer meets the insulating layer and extending below the conductor layer, and a second region of opposite conductivity type within the semiconductor layer generally beginning where the conductor layer meets the insulting layer and extending below the insulating layer, the second region having a lower concentration of dopants, so that there is formed an asymmetric guard ring, and the opening in the insulating layer has an edge which is bevelled with a slope of between 0.1 and 0.4.

7 Claims, 1 Drawing Sheet

OTHER PUBLICATIONS

Lepselter et al., "Silicon Schottky Barrier Diode with Near-Ideal I-V Characteristics," *The Bell System Tech Journal,* vol. 47, No. 2, Feb. 68, pp. 195-208.
Proceedings of the IEEE, vol. 55, No. 8, Aug. 1967, "High-Voltage Planar P-N Junctions," Y. C. Kao and E. D. Wolley.
Bell System Technical Journal, vol. 47, No. 2, Feb. 1968, "Silicon Schottky Barrier Diode with Near-Ideal I-V Characteristics," M. P. Lepselter & S. M. Sze.
IEEE Spectrum, vol. 7, No. 3, Mar. 1970, "The Metal-Semiconductor Contact: An Old Device with a New Future," A. Y. C. Yu
IEEE Transactions on Electronic Devices, vol. ed-24, No. 2, Feb. 1977, "Theory and Breakdown Voltage for Planar Devices with a Single Field Limiting Ring," M. S. Adler, V. A. K. Temple, A. P. Ferro, R. C. Rustay.
Solid State Electronics, vol. 6, 1963, "Metal-Semiconductor Rectifiers and Transistors," B. R. Gossier.

SCHOTTKY BARRIER DEVICE WITH DOPED COMPOSITE GUARD RING

This application is a division of application Ser. No. 703,703, filed 2-21-85, now U.S. Pat. No. 4,638,551, which is a continuation of Ser. No. 422,386, filed 9-24-82, now abandoned.

FIELD OF INVENTION

Schottky barrier devices comprise a conductor-semiconductor interface which acts as a rectifying junction. Theoretically, these devices have numerous applications because of their high-speed operation. However, in their simplest form, Schottky barrier devices exhibit a high reverse bias leakage current, and the reverse bias breakdown voltage is poorly defined and less than one-half the theoretical value. These deficiencies in operating characteristics are caused primarily by current flowing across the edge portion of the barrier when the device is reverse biased. To reduce this edge current flow, the regions in the semiconductor material underlying the edge of the Schottky barrier are doped with an impurity that provides a conductivity opposite to that of the remainder of this material. These oppositely doped regions are known as guard rings. Even with guard rings, however, the performance of Schottky barrier devices is significantly below theoretical values.

SUMMARY OF THE INVENTION

The present invention is an improved Schottky barrier device and a method of manufacturing such a device. The improvement lies in the insertion of an outer second guard ring portion in the semiconductor material adjacent the outer surface of the inner first ring portion and doped with the same type impurity as the first ring portion but at a substantially different concentration. This second ring portion widens the depletion region surrounding the first ring which causes a lowering of the electric field strength in this region. As a result, the breakdown voltage for the Schottky barrier device is increased without loss in speed or current handling capacity. The second ring portion lies generally below the insulating layer that is adjacent the conductor layer of the Schottky barrier. After the insulating layer is deposited but prior to laying the conductor layer of the Schottky barrier, both the first and second ring portions are inserted economically in one manufacturing step using the ion-implantation method. By properly adjusting the energy level and concentration of the ion implant, the concentration of impurities passing through the insulating layer and forming the second ring portion is significantly lower than the concentration of impurities passing directly into the semiconductor material and forming the first ring. The breakdown voltage at the interface between the ring portions and the oppositely-doped surrounding semiconductor material is higher than the breakdown voltage of the conductor-semiconductor interface forming the Schottky barrier. As a result, breakdown of the device occurs first along the Schottky barrier. In a second embodiment, after the ion-implantation step, the ring portion are deepened by diffusion causing the breakdown voltage along the ring-surrounding semiconductor interface to fall below the breakdown voltage of the Schottky barrier. As a result, in this second embodiment, breakdown of the device occurs first at the ring-surrounding semiconductor junction. In a third embodiment, the insulating layer is beveled along the edge contacting the conductor. This geometry results in a second ring portion of gradually decreasing impurity concentration in the direction away from the conductor layer because of the decreasing number of ions able to penetrate the insulating layer to form the second ring. As a result, the electric field in the depletion region surrounding the rings and along the Schottky barrier is more evenly distributed, and the breakdown voltage for the device is increased.

BRIEF DESCRIPTION OF THE DRAWINGS

The Figures are representational only and are not drawn to scale. The same reference characters are applied to similar elements throughout the drawings.

DESCRIPTION OF THE PREFERRED EMBODIMENT

Figure 1:
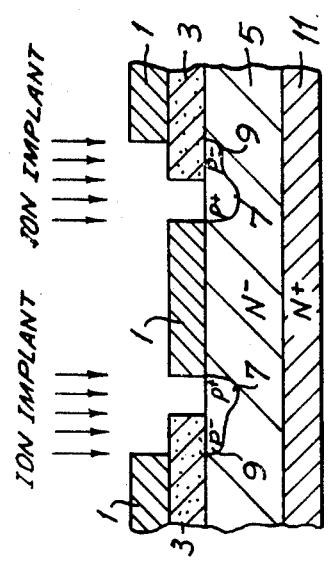
FIGS. 1 and 3 are cross-sectional views of semiconductor wafers showing the step in the manufacture of a Schottky barrier device of forming a double guard ring by the ion-implantation method.

FIG. 1 shows a semiconductor wafer such as silicon with substrate 11 heavily doped with impurities such as phosphorous to form an N-type of conductivity and epitaxial layer 5 more lightly doped with N-type impurities. While N-type impurities are used in the substrate and epitaxial layer of the present embodiment, it is possible also to use P-type impurities. The thickness and impurity concentration of epitaxial layer 5 depends on the particular breakdown voltage desired for the Schottky barrier device. Breakdown voltage increases with increasing thickness and decreasing impurity concentration of the epitaxial layer. For a device using the present invention, a breakdown voltage of 50 V was achieved with epitaxial layer 5 having a thickness of 5 microns and an impurity concentration of $7 \times 10^{15}$ atoms/cm$^3$, and a breakdown voltage of 120 V was achieved with an epitaxial layer having a thickness of 8 microns and an impurity concentration of $2 \times 10^{15}$ atoms/cm$^3$. An insulating layer 3 such as silicon oxide is formed on the epitaxial layer and an opening or window, typically 1 to 50 mils in diameter, is etched in the insulating layer by conventional photoetching techniques. The insulating layer thickness ranges between 2000 Å and 3000 Å. A layer of photoresistant material 1 such as KPR manufactured by Eastman Kodak is deposited on the silicon oxide layer and on the exposed portion of the epitaxial layer, and using conventional methods, an annular opening is formed in the photoresistant layer surrounding the periphery of the insulating layer, such that adjacent annular areas of the insulating and epitaxial layers are exposed. Using the ion implantation method, a guard ring having adjacent ring portions 7 and 9 is formed in the epitaxial layer by perpendicularly directing at the annular opening in the photoresistant layer activated ions of a type producing a conductivity opposite to that of the epitaxial layer. These ions enter the epitaxial layer where it is exposed and, to a lesser extent, the epitaxial layer where it is covered only by the insulating layer. These ions are unable to penetrate the photoresistant layer. In this embodiment, activated ions such as boron are used to produce a P-type conductivity in the guard ring.

After formation of the guard rings, Schottky barrier 21 is formed by removing photoresistant layer 1 and depositing conductor layer 13 which may be a metallic material such as nickel, chromium, or tungsten in a layer between 500 Å and 2000 Å thick. The conductor layer 13 covers the surface of epitaxial layer 5 where it is exposed by the circular opening in insulating layer 3. In this embodiment, the conductor layer also covers a portion of the surface of the insulating layer adjacent this opening. In this example, conductor layer 13 extends about 1 mil beyond the circumference that is directly above the outermost circumference of the guard ring portions. A Schottky barrier diode is constructed by additionally depositing contact metals 15 and 17 which may be a layer of platinum between 500 Å and 2000 Å thick and a layer of silver between 1 micron and 5 microns thick, respectively. These metals act as one terminal for the diode. A layer of contact metal 19 deposited on substrate layer 11 serves as the second terminal.

By adjusting the energy of the ion implant to a relatively low level, about 70 keV, only a small percentage of the ions striking insulating layer 3 are able to penetrate this layer to form guard ring portion 9. However, even at this relatively low energy level, virtually all the ions striking the epitaxial layer directly are able to penetrate into this layer to form guard ring portion 7. Therefore, the method of this invention enables the formation of two adjacent guard ring portions of substantially different net impurity concentrations in one manufacturing step.

It will be convenient for this application to describe such a guard ring, consisting of an innermost portion of different net impurity concentrations or doping levels, as an asymmetric guard ring.

With the thickness of insulating layer 3 known, the energy and impurity concentration or dose of the ion implant is selected to produce a net concentration of impurity atoms in outer ring portion 9 of between $4 \times 10^{11}$ atoms/cm$^2$ and $1.2 \times 10^{12}$ atoms/cm$^2$ and in inner ring portion 7 of between $5 \times 10^{12}$ atoms/cm$^2$ and $1 \times 10^{15}$ atoms/cm$^2$. If conductor layer 13 extends beyond the outermost circumference of the guard rings, then the net impurity concentration of ring 9 should be at the higher end of its range. If the conductor layer stops before this circumference, then the net impurity concentration for ring 9 should be at the lower end of its range. The depth or thickness for ring portion 9 should be approximately 2000 Å and for ring portion 7 between 0.5 microns and 1 micron. The width of ring portion 7 in this example is approximately twice the thickness of epitaxial layer 5. The width of ring portion 9 should approximately equal the thickness of the epitaxial layer if conductor layer 13 extends beyond the outermost circumference of the guard rings, and, if the conductor layer does not extend beyond this circumference, the width of ring 9 should be approximately twice the thickness of the epitaxial layer.

Lightly doped guard ring portion 9 adjacent to heavily doped guard ring portion 7 produces a wider depletion region having a lower and more evenly distributed electric field than that surrounding only one heavily doped ring. The result is a higher overall breakdown voltage for the Schottky barrier device. This improvement is effected without increasing the thickness of the epitaxial layer and without a loss in the device's speed or current handling capacity. Moreover, since ring portion 7 is heavily doped and lightly doped ring portion 9 lies below insulating layer 3, there is no practical production of a parasitic Schottky transistor.

Figure 2:
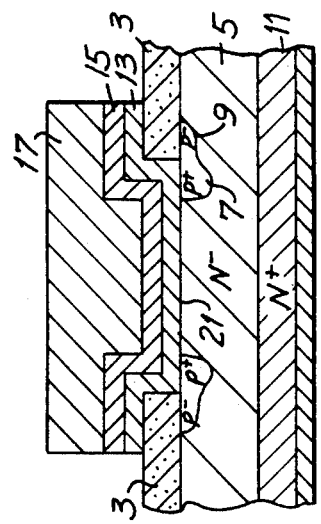
FIGS. 2 and 4 are cross-sectional views of Schottky barrier diodes formed by removing the photoresistant layer and adding conductor layers to the wafers of FIGS. 1 and 3, respectively.
Figure 4:
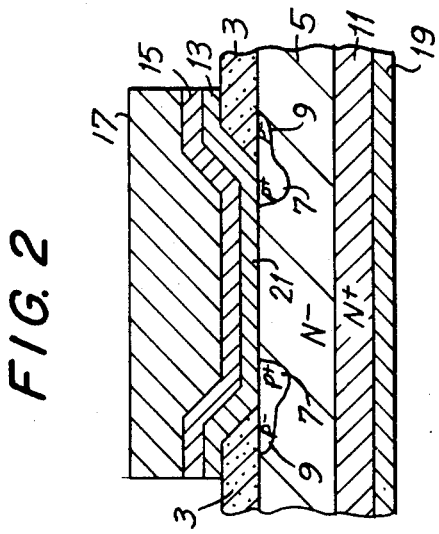
Figure 3:
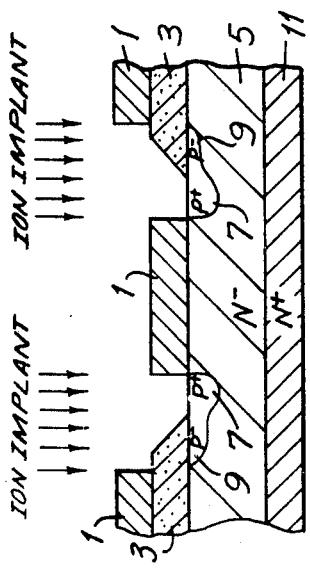

In the embodiment illustrated in FIGS. 3 and 4, the impurity concentration of guard ring 9 gradually decreases in the direction away from the conductor layer. This gradient in the concentration of ring 9 is produced by beveling the peripheral edge of insulating layer 3 prior to implanting the rings. The gradient removes electric field irregularities in the region between the two rings and further improves the breakdown characteristics of the Schottky device. The bevel on the insulating layer is formed using the known photoetching technique of depositing a layer of silane over the insulating layer prior to etching the opening or window in this layer. This bevel has a slope of between 0.25 and 0.4. It would be preferable to have a slope of about 0.1; however, this present technique imposes a limit of about 0.25 on this slope. The specifications and manufacturing method for the embodiment of FIGS. 3 and 4 are in all other respects the same as for the embodiment of FIGS. 1 and 2.

In another embodiment (not shown), after the ion-implantation step, the rings are deepened and, to a lesser extent, widened by diffusion to cause the breakdown voltage along the ring-surrounding semiconductor interface to fall below the breakdown voltage of the Schottky barrier. Diffusion is effected at about 1000° C. for approximately eight hours and results approximately in a doubling in the depth of the two rings and an increase in width for each ring equal to about two-thirds its increase in depth. The initial impurity concentration of each ring is increased somewhat to compensate for this diffusion.

Of course, it should be understood that although the specific asymmetric guard ring embodiments described involve a circular semiconductor wafer, circular layers of other materials and annular or circular openings in these layers, this invention is not limited to any particular geometric shape or form.

I claim:
1. A Schottky barrier device comprising
    (a) a semiconductor layer whose major portion is of a first conductivity type,
    (b) an insulating layer covering one face of the semiconductor layer, the insulating layer having an opening therein,
    (c) a conductor layer extending over a portion of the insulating layer including the opening for making contact with said one face of the semiconductor layer, said contact being rectifying where made to the portion of the first conductivity type, and
    (d) an asymmetric guard ring in the semiconductor layer at said one face and of the conductivity type opposite the first conductivity type and including an innermost ring portion of a first doping level for forming an inner PN junction portion with the bulk portion of the semiconductor layer, said inner ring portion generally underlying and contacting a portion of the conductor layer, and an outermost ring portion of a second doping level for forming an outer PN junction portion with the bulk portion of the semiconductor layer, said outer ring portion generally underlying and contacting a portion of the insulating layer and said first doping level being higher than said second doping level.
2. The Schottky barrier device of claim 1 in which the semiconductor is silicon and the conductor layer is a silicide.

3. The Schottky barrier device of claim 1 in which the semiconductor layer is an epitaxial layer on a semiconductor substrate of the first conductivity type and of a lower resistivity than the resistivity of said substrate.

4. The Schottky barrier device of claim 1 in which the opening in the insulating layer has a bevelled edge whose slope is between 0.1 and 0.4 where the slope is the ratio of the height of the unbevelled insulating layer to the projection of the bevelled edge on the face of the semiconductor layer.

5. The Schottky barrier device of claim 1 in which the conductor layer includes a central portion which contacts the face of the semiconductor layer and an outer portion which overlaps the opening in the insulating layer.

6. A Schottky barrier device in accordance with claim 3 in which the width of the outermost ring portion is at least equal to the thickness of the epitaxial layer.

7. A Schottky barrier device in accordance with claim 6 in which the depth of the PN junction portion along the edge of the innermost ring portion is at least twice the depth of the PN junction portion along the edge of the outermost ring portion.

* * * * *